(12) United States Patent
Wang et al.

(10) Patent No.: US 10,651,358 B2
(45) Date of Patent: May 12, 2020

(54) LIGHT EMITTING DEVICE PACKAGE STRUCTURE WITH CIRCUIT REDISTRIBUTION STRUCTURE AND MANUFACTURING METHOD THEREOF

(71) Applicant: Unimicron Technology Corp., Taoyuan (TW)

(72) Inventors: Pei-Wei Wang, Taipei (TW); Cheng-Ta Ko, Taoyuan (TW); Yu-Hua Chen, Hsinchu (TW); De-Shiang Liu, Taoyuan (TW); Tzyy-Jang Tseng, Taoyuan (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 16/140,563

(22) Filed: Sep. 25, 2018

(65) Prior Publication Data
US 2020/0006610 A1 Jan. 2, 2020

(30) Foreign Application Priority Data

Jul. 2, 2018 (TW) .............................. 107122835 A

(51) Int. Cl.
*H01L 33/62* (2010.01)
(52) U.S. Cl.
CPC ...... *H01L 33/62* (2013.01); *H01L 2933/0033* (2013.01)

(58) Field of Classification Search
CPC ............. H01L 33/62; H01L 2933/0033; H01L 25/167
See application file for complete search history.

(56) References Cited

U.S. PATENT DOCUMENTS

| | | |
|---|---|---|
| 2017/0215288 A1 | 7/2017 | Shi |
| 2018/0122787 A1* | 5/2018 | Chu ...................... H01L 25/167 |

* cited by examiner

*Primary Examiner* — Quoc D Hoang
(74) *Attorney, Agent, or Firm* — CKC & Partners Co., LLC

(57) ABSTRACT

A light emitting device package structure includes a substrate, a circuit layer structure, a light emitting device, a first redistribution layer, a conductive connector, a second redistribution layer, and a chip. The circuit layer structure is disposed over the substrate, and the circuit layer structure includes a first circuit layer. The light emitting device is disposed over the circuit layer structure and is electrically connected with the first circuit layer. The first redistribution layer is disposed over the light emitting device and includes a second circuit layer and a conductive contact contacting the second circuit layer. The conductive connector connects the first circuit layer and the second circuit layer. The second redistribution layer is disposed over the first redistribution layer and includes a third circuit layer contacting the conductive contact. The chip is disposed over the second redistribution layer and is electrically connected with the third circuit layer.

7 Claims, 18 Drawing Sheets

LIGHT EMITTING DEVICE PACKAGE STRUCTURE WITH CIRCUIT REDISTRIBUTION STRUCTURE AND MANUFACTURING METHOD THEREOF

RELATED APPLICATIONS

This application claims priority to Taiwan Application Serial Number 107122835, filed Jul. 2, 2018, which is herein incorporated by reference.

BACKGROUND

Field of Invention

The present invention relates to a light emitting device package structure, and a manufacturing method of the light emitting device package structure.

Description of Related Art

In general, driving chips are disposed in the peripheral area of the display device such as a mobile phone, a tablet computer or the like. However, this design reduces the display area of the display device. In recent years, a chip-on-film (COF) technology has been employed to narrow the peripheral area of a display device. That is, a portion of a flexible circuit board (FPC) is attached to the front side of the substrate of the display device, and another portion of the flexible circuit board is bent to the back side. Since the driving chip is disposed on the flexible circuit board that locates on the back side, the required space of the peripheral area can be reduced.

However, bending the flexible circuit board causes stress in the portion of the flexible circuit board that contacts the substrate. Therefore, the portion is easily peeled off or broken, and the wiring on the flexible circuit board is also prone to breakage. In addition, it is still necessary to reserve a space of the substrate for connecting with the flexible circuit board. Therefore, the peripheral area of the display device cannot be effectively narrowed.

SUMMARY

An aspect of the present invention provides a light emitting device package structure comprising a protective substrate, a circuit layer structure, a light emitting device, a first redistribution layer, a conductive connector, a second redistribution layer, and a chip. The circuit layer structure is disposed over the substrate, and the circuit layer structure includes a first circuit layer. The light emitting device is disposed over the circuit layer structure or between the protective substrate and the circuit layer structure, wherein the light emitting device is electrically connected with the first circuit layer. The first redistribution layer is disposed over the light emitting device, and the first redistribution layer includes a second circuit layer and a conductive contact that contacts the second circuit layer. The conductive connector connects the first circuit layer and the second circuit layer. The second redistribution layer is disposed over the first redistribution layer, and the second redistribution layer includes a third circuit layer that contacts the conductive contact. The chip is disposed over the second redistribution layer and is electrically connected with the third circuit layer.

In some embodiments of the present invention, the first redistribution layer further includes a first insulating layer covering the second circuit layer. The first insulating layer has a through-hole exposing a portion of the second circuit layer. The conductive contact is filled in the through-hole to contact the second circuit layer.

In some embodiments of the present invention, the second redistribution layer further includes a second insulating layer covering the third circuit layer. The second insulating layer has an opening exposing a portion of the third circuit layer. The chip is electrically connected with the third circuit layer through the opening.

In some embodiments of the present invention, a line width and a line pitch of the second circuit layer are less than 8 micrometers, and a line width and a line pitch of the third circuit layer are less than 8 micrometers.

Another aspect of the present invention provides a light emitting device package structure comprising a protective substrate, a light emitting device, a first redistribution layer, a second redistribution layer, and a chip. The light emitting device is disposed over the protective substrate. The first redistribution layer is disposed over the light emitting device, and the first redistribution layer includes a first circuit layer that is electrically connected with the light emitting device. The second redistribution layer is disposed over the first redistribution layer, and the second redistribution layer includes a second circuit layer and a conductive contact that contacts the first circuit layer and the second circuit layer. The chip is disposed over the second redistribution layer and electrically connected with the second circuit layer.

In some embodiments of the present invention, the second redistribution layer further includes an insulating layer covering the first circuit layer. The insulating layer has a through-hole exposing a portion of the first circuit layer. The conductive contact is filled in the through-hole to contact the first circuit layer and the second circuit layer.

In some embodiments of the present invention, a line width and a line pitch of the first circuit layer are less than 8 micrometers, and a line width and a line pitch of the second circuit layer are less than 8 micrometers.

Another aspect of the present invention provides a manufacturing method of a light emitting device package structure comprising following operations: (i) providing a circuit redistribution structure; (ii) providing a first substrate; (iii) forming a circuit layer structure over the first substrate, wherein the circuit layer structure includes a first circuit layer; (iv) before or after operation (iii), placing a light emitting device between the first substrate and the circuit layer structure or over the circuit layer structure, wherein the light emitting device is electrically connected with the first circuit layer; and (v) placing the circuit redistribution structure over the light emitting device, wherein the circuit redistribution structure includes a first redistribution layer, a second redistribution layer, and a chip; wherein the first redistribution layer includes a second circuit layer and a conductive contact that contacts the second circuit layer; wherein the second circuit layer is electrically connected with the first circuit layer through a conductive connector; wherein the second redistribution layer includes a third circuit layer that contacts the conductive contact, and the third circuit layer is electrically connected with the chip.

In some embodiments of the present invention, operation (i) includes the following sub-operations: (a) forming the first redistribution layer over a second substrate; (b) forming the second redistribution layer over the first redistribution layer; (c) placing the chip over the second redistribution layer; and (d) peeling off the second substrate to expose the second circuit layer to form the circuit redistribution structure.

Another aspect of the present invention provides a manufacturing method of a light emitting device package structure comprising following operations: (i) providing a circuit redistribution structure having a substrate, a first redistribution layer, and a second redistribution layer; wherein the first redistribution layer is disposed over the substrate, and the first redistribution layer includes a first circuit layer and a conductive contact that contacts the first circuit layer; wherein the second redistribution layer is disposed over the first redistribution layer, and the second redistribution layer includes a second circuit layer that contacts the conductive contact; (ii) placing a light emitting device over the second redistribution layer, wherein the light emitting device is electrically connected with the second circuit layer; (iii) peeling off the substrate to expose the first circuit layer before or after operation (ii); and (iv) placing a chip below the first redistribution layer, wherein the chip is electrically connected with the first circuit layer.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
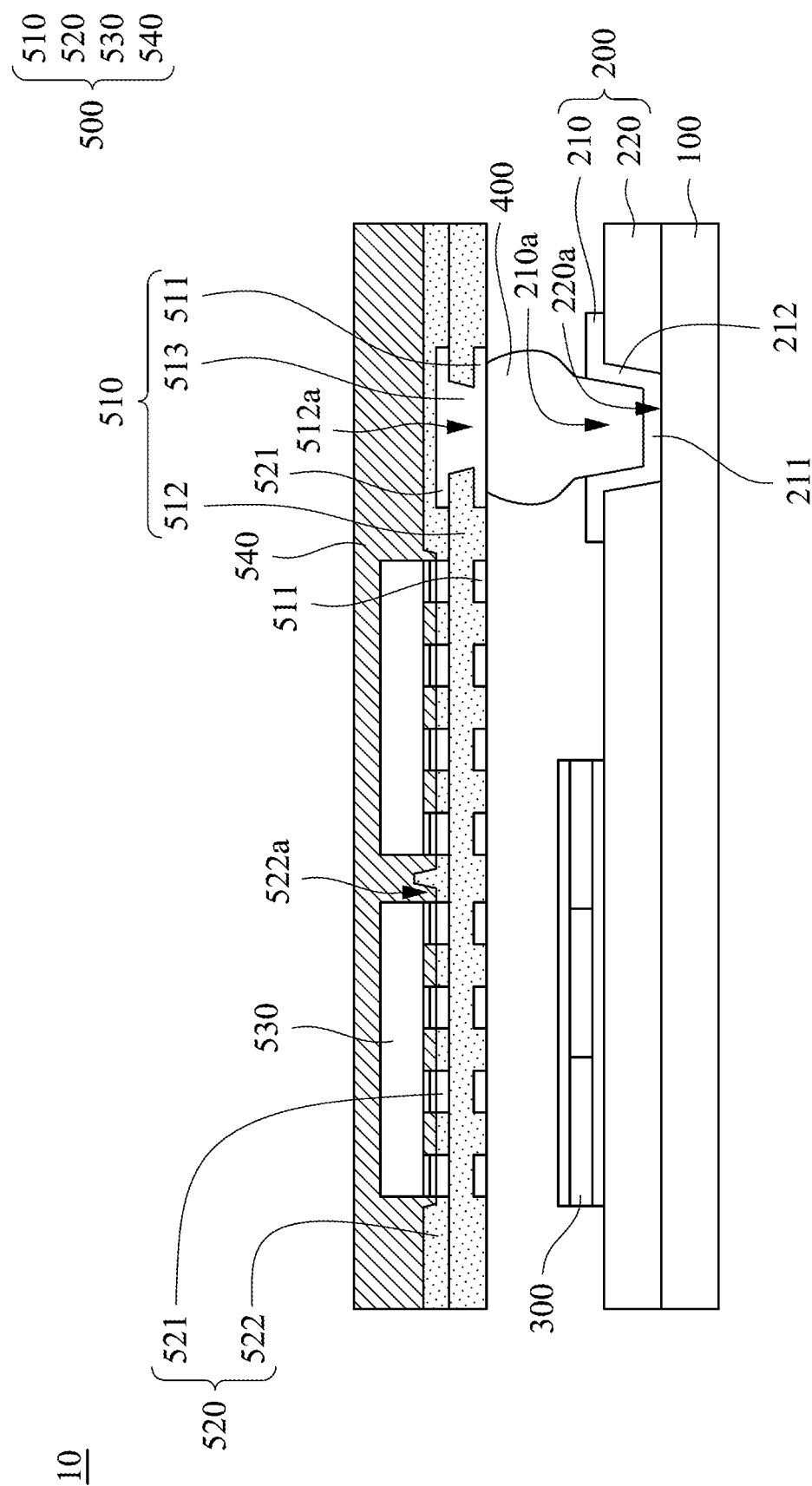
FIG. 1 is a cross-sectional view illustrating a light emitting device package structure according to the first embodiment of the present invention.

Reference will now be made in detail to the present embodiments of the invention, examples of which are illustrated in the accompanying drawings. Wherever possible, the same reference numbers are used in the drawings and the description to refer to the same or like parts.

Before describing the preferred embodiment in more detail, further explanation shall be given regarding certain terms that may be used throughout the descriptions.

FIG. 1 is a cross-sectional view illustrating a light emitting device package structure 10 according to the first embodiment of the present invention. As shown in FIG. 1, the light emitting device package structure 10 includes a protective substrate 100, a circuit layer structure 200, a light emitting device 300, a conductive connector 400, and a circuit redistribution structure 500.

The protective substrate 100 can be a transparent substrate commonly used in general display devices. In some embodiments, the protective substrate 100 is a flexible substrate, such as a polyimide (PI) substrate. In other embodiments, the protective substrate 100 is a rigid substrate, such as a glass substrate or a plastic substrate.

The circuit layer structure 200 is disposed over the protective substrate 100. Specifically, the circuit layer structure 200 includes a first circuit layer 210 and a dielectric layer 220, and the first circuit layer 210 is disposed on an upper surface of the dielectric layer 220. In some embodiments, the first circuit layer 210 includes any conductive material, for example, metals such as copper, nickel or silver. It should be noted that the dielectric layer 220 is transparent, so that the light emitted from the light emitting device 300 can pass through the dielectric layer 220 and the protective substrate 100 to the outside of the structure. In some embodiments, the dielectric layer 220 includes a transparent photoimageable dielectric (PID). As shown in FIG. 1, the dielectric layer 220 has an opening 220a, and the first circuit layer 210 includes a bottom portion 211 and a sidewall portion 212 respectively disposed on the bottom surface and the sidewall of the opening 220a. In detail, the width of the opening 220a is gradually narrowed from the top toward the bottom, so that the opening 220a presents a trapezoidal shape. The bottom portion 211 and the sidewall portion 212 of the first circuit layer 210 are conformal to the opening 220a, so that the bottom portion 211 and the sidewall portion 212 of the first circuit layer 210 define a recess 210a that has substantially the same shape as the opening 220a. The sidewall portion 212 of the first circuit layer 210 is adjacent to the end of the bottom portion 211 and extends upward beyond the upper surface of the bottom portion 211. In more detail, the angle between the inner surface of the sidewall portion 212 and the upper surface of the bottom portion 211 is an obtuse angle. In other words, the width of the recess 210a is gradually narrowed from the top toward the bottom, so that the recess 210a presents a trapezoidal shape. It should be noted that a certain technical effect can be achieved when the width of the recess 210a is gradually narrowed from the top toward the bottom, which will be described in detail below.

The light emitting device 300 is disposed over the circuit layer structure 200 and electrically connected with the first circuit layer 210. In some embodiments, the light emitting device 300 includes an organic light emitting diode device. Although in FIG. 1 shows that the light emitting device 300 is not in contact with the first circuit layer 210, it should be understood that the light emitting device 300 can be electrically connected with the first circuit layer 210 in any manner when viewed in a different angle. For example, in some embodiments, the light emitting device 300 is attached and electrically connected to the first circuit layer 210 by a conductive adhesive. Alternatively, in other embodiments, the light emitting device 300 may be attached and electrically connected to the first circuit layer 210 in other manners.

The circuit redistribution structure 500 is disposed over the light emitting device 300, and the circuit redistribution structure 500 includes a first redistribution layer 510, a second redistribution layer 520, and a chip 530.

The first redistribution layer 510 is disposed over the light emitting device 300. Specifically, the first redistribution layer 510 includes a second circuit layer 511, a first insulating layer 512, and a conductive contact 513. In some embodiments, the second circuit layer 511 includes any conductive material, for example, metals such as copper, nickel or silver. In some embodiments, the second circuit layer 511 has a line width and a line pitch of less than 8 micrometers, such as 7 micrometers, 6 micrometers, 5 micrometers, 4 micrometers, 3 micrometers, 2 micrometers, 1 micrometers, or 0.5 micrometers. The first insulating layer 512 covers the second circuit layer 511, and the first insulating layer 512 has a through-hole 512a. In some embodiments, the first insulating layer 512 includes a photoimageable dielectric. The through-hole 512a exposes a portion of the second circuit layer 511, and the conductive contact 513 is filled in the through-hole 512a, so that the conductive contact 513 contacts the second circuit layer 511. The conductive contact 513 may be a metal pillar, and includes, for example, a conductive metal such as copper, nickel or silver. As shown in FIG. 1, the width of the conductive contact 513 is gradually narrowed from the top toward the bottom, so that the conductive contact 513 presents a trapezoidal shape, but the shape is not limited thereto.

The second redistribution layer 520 is disposed over the first redistribution layer 510. Specifically, the second redistribution layer 520 includes a third circuit layer 521 and a second insulating layer 522. The third circuit layer 521 contacts the conductive contact 513. In some embodiments, the third circuit layer 521 includes any conductive material, for example, metals such as copper, nickel or silver. In some embodiments, the third circuit layer 521 has a line width and a line pitch of less than 8 micrometers, such as 7 micrometers, 6 micrometers, 5 micrometers, 4 micrometers, 3 micrometers, 2 micrometers, 1 micrometers, or 0.5 micrometers. The second insulating layer 522 covers the third circuit layer 521, and the second insulating layer 522 has an opening 522a. In some embodiments, the second insulating layer 522 includes a photoimageable dielectric. Specifically, the opening 522a exposes a portion of the third circuit layer 521.

The chip 530 is disposed over the second redistribution layer 520, and the chip 530 is electrically connected with the third circuit layer 521 through the opening 522a. Specifically, a plurality of metal bumps (eg, chip pins) are disposed on a lower surface of the chip 530, and the metal bumps are bonded to the exposed portion of the third circuit layer 521 through a solder material, so that the chip 530 is electrically connected with the third circuit layer 521. It should be understood that although the light emitting device package structure 10 illustrated in FIG. 1 includes two chips 530, in other embodiments, the number of chips 530 may be more than two or less than two.

The conductive connector 400 connects the first circuit layer 210 and the second circuit layer 511. It should be noted that in the case where the light emitting device 300 includes a polysilicon (for example, the light emitting device 300 is an organic light emitting diode device), the process temperature of forming the conductive connector 400 should be in the range from a room temperature to 600° C. When the process temperature exceeds 600° C., the crystal structure of the polycrystalline silicon may be damaged. When the process temperature is lower than room temperature, the connection of the conductive connector 400 to the first circuit layer 210 is unstable, so that peeling may occur. Therefore, the conductive connector 400 can be a solder ball including a solder material that has a melting point below 600° C., such as tin-bismuth. As discussed above, a certain technical effect can be achieved when the width of the recess 210a is gradually narrowed from the top toward the bottom. Specifically, the bottom of the conductive connector 400 is embedded in the recess 210a, so that the conductive connector 400 can be stably fixed on the first circuit layer 210 and is not easily peeled off. In some embodiments, the conductive connector 400 can be a metal pillar, such as a copper pillar. In the embodiments where the conductive connector 400 is a metal pillar, the operations of forming the metal pillar include: (a) forming a metal bump that connects the second circuit layer 511, wherein the bottom width of the metal bump is greater than the width of the bottom surface of the recess 210a, (b) aligning the metal bump with the recess 210a, and (c) thermal compressing the metal bump to the first circuit layer 210 to form the metal pillar connected to the first circuit layer 210. Since the width of the recess 210a is gradually narrowed from the top toward the bottom, and the bottom width of the metal bump is greater than the width of the bottom surface of the recess 210a, the bottom of the metal bump contacts and is subjected to pressure from the sidewall portion 212 of the first circuit layer 210 when the thermal compression is performed. The pressure that the bottom of the metal bump is subjected to can reduce the melting point of the pressed portion of the metal bump. Therefore, the bottom of the metal bump can be melted at a temperature, that does not affect the light emitting device 300, to form a metal pillar that connects the first circuit layer 210 and the second circuit layer 511.

In some embodiments, the light emitting device package structure 10 further includes a protective layer 540. The protective layer 540 covers the chip 530 and the second insulating layer 522 and is filled in the gap between the chip 530 and the second insulating layer 522. Therefore, the protective layer 540 can protect the bonding between the metal bumps of the chip 530 and the third circuit layer 521, thereby preventing the occurrence of peeling. On the other hand, the protective layer 540 can also block moisture permeation and avoid oxidation of the metal bumps, the solder material, and the third circuit layer 521. In some embodiments, the protective layer 540 includes a resin.

Figure 2:
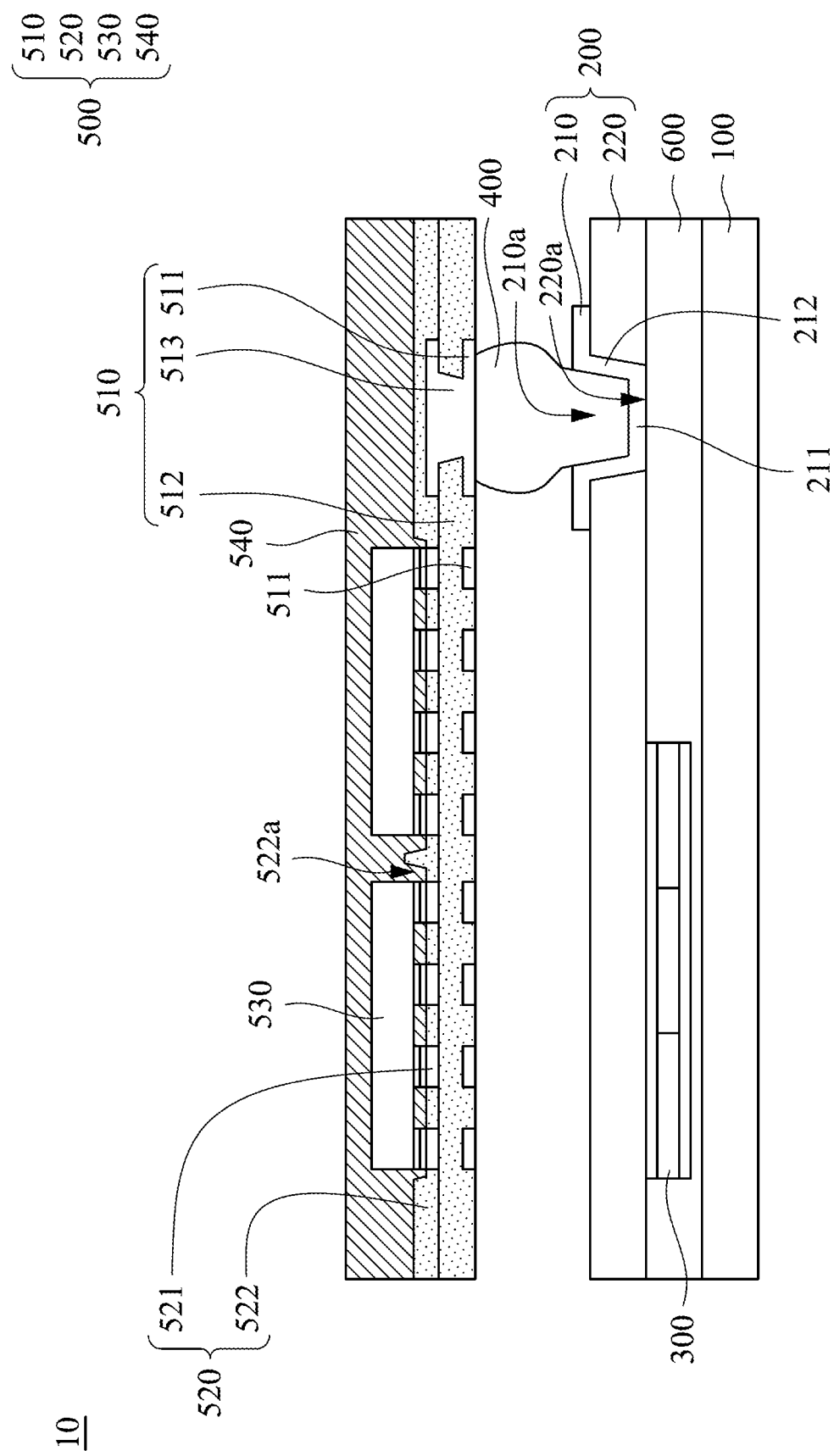
FIG. 2 is a cross-sectional view illustrating a light emitting device package structure according to the second embodiment of the present invention.

FIG. 2 is a cross-sectional view illustrating a light emitting device package structure 10 according to the second embodiment of the present invention. The light emitting device package structure 10 of FIG. 2 is similar to that of FIG. 1, except that the light emitting device 300 of FIG. 2 is disposed between the protective substrate 100 and the circuit layer structure 200. In addition, the light emitting device package structure 10 further includes a transparent adhesive layer 600. The transparent adhesive layer 600 covers the sidewall of the light emitting device 300 and is disposed between the protective substrate 100 and the circuit layer structure 200. In some embodiments, the transparent adhesive layer 600 includes an optically clear adhesive (OCA). It should be noted that in FIG. 2, the same or similar elements as those in FIG. 1 are given the same reference numerals, and the description thereof is omitted. In the light emitting device package structure 10 of FIG. 2, the dielectric layer 220 may be transparent or non-transparent. In some embodiments, dielectric layer 220 includes a transparent photoimageable dielectric or a non-transparent photoimageable dielectric.

Figure 3:
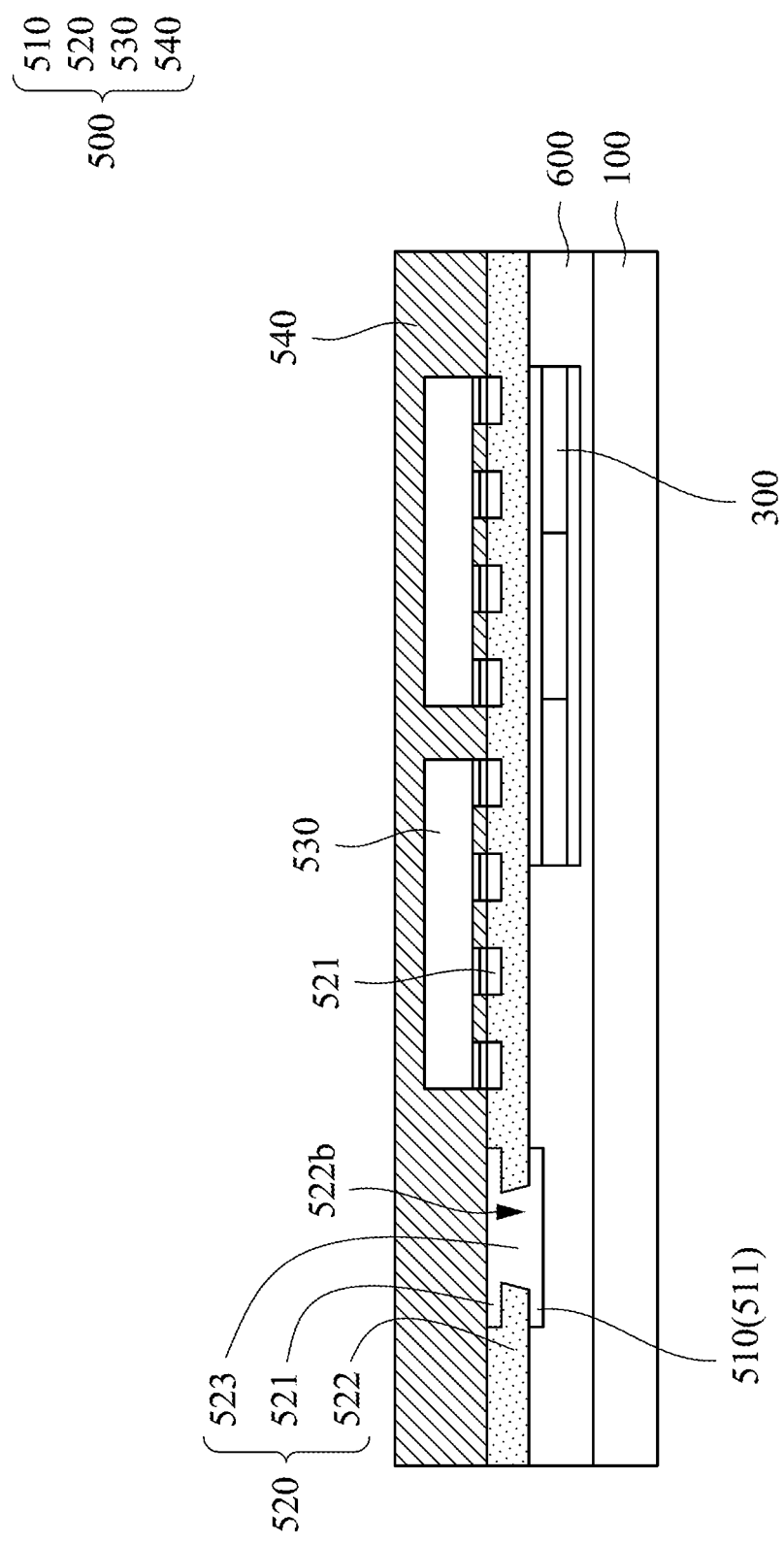
FIG. 3 is a cross-sectional view illustrating a light emitting device package structure according to the third embodiment of the present invention.

FIG. 3 is a cross-sectional view illustrating a light emitting device package structure 10 according to the third embodiment of the present invention. As shown in FIG. 3, the light emitting device package structure 10 includes a protective substrate 100, a light emitting device 300, a transparent adhesive layer 600, and a circuit redistribution structure 500. The light emitting device 300 is disposed over the protective substrate 100. The transparent adhesive layer 600 covers the sidewall of the light emitting device 300 and is disposed over the protective substrate 100. The circuit redistribution structure 500 is disposed over the light emitting device 300 and the transparent adhesive layer 600, and the circuit redistribution structure 500 includes a first redistribution layer 510, a second redistribution layer 520, and a chip 530. It should be noted that the materials of the protective substrate 100, the light emitting device 300, and the transparent adhesive layer 600 are the same as these described above, and the description thereof is omitted.

The first redistribution layer 510 is disposed over the light emitting device 300 and the transparent adhesive layer 600. The first redistribution layer 510 includes a first circuit layer 511. The first circuit layer 511 is electrically connected with the light emitting device 300. In some embodiments, the first circuit layer 511 includes any conductive material, for example, metals such as copper, nickel or silver. In some embodiments, the first circuit layer 511 has a line width and a line pitch of less than 8 micrometers, such as 7 micrometers, 6 micrometers, 5 micrometers, 4 micrometers, 3 micrometers, 2 micrometers, 1 micrometers, or 0.5 micrometers. Although in FIG. 3 shows that the light emitting device 300 is not in contact with the first circuit layer 511, it should be understood that the light emitting device 300 can be electrically connected with the first circuit layer 511 in any manner when viewed in a different angle.

The second redistribution layer 520 is disposed over the first redistribution layer 510. Specifically, the second redistribution layer 520 includes a second circuit layer 521, an insulating layer 522, and a conductive contact 523. In some embodiments, the second circuit layer 521 includes any conductive material, for example, metals such as copper, nickel or silver. In some embodiments, the second circuit layer 521 has a line width and a line pitch of less than 8 micrometers, such as 7 micrometers, 6 micrometers, 5 micrometers, 4 micrometers, 3 micrometers, 2 micrometers, 1 micrometers, or 0.5 micrometers. The insulating layer 522 covers the first circuit layer 511, and the insulating layer 522 has a through-hole 522b. In some embodiments, insulating layer 522 includes a photoimageable dielectric. The through-hole 522b exposes a portion of the first circuit layer 511, and the conductive contact 523 is filled in the through-hole 522b, so that the conductive contact 523 contacts the first circuit layer 511 and the second circuit layer 521. The conductive contact 523 may be a metal pillar, and includes, for example, a conductive metal such as copper, nickel or silver. As shown in FIG. 3, the width of the conductive contact 523 is gradually widened from the top toward the bottom, so that the conductive contact 523 presents a trapezoidal shape, but the shape is not limited thereto.

The chip 530 is disposed over the second redistribution layer 520 and electrically connected with the second circuit layer 521. Specifically, a plurality of metal bumps (eg, chip pins) are disposed on a lower surface of the chip 530, and the metal bumps are bonded to the second circuit layer 521 through a solder material.

In some embodiments, the light emitting device package structure 10 further includes a protective layer 540. The protective layer 540 covers the chip 530, the second circuit layer 521, and the insulating layer 522, and the protective layer 540 is filled in the gap between the chip 530 and the insulating layer 522. Therefore, the protective layer 540 can protect the bonding between the metal bumps of the chip 530 and the second circuit layer 521, thereby preventing the occurrence of peeling. On the other hand, the protective layer 540 can also block moisture permeation and avoid oxidation of the metal bumps, the solder material, and the second circuit layer 521.

A manufacturing method of the light emitting device package structure 10 is also provided herein. FIGS. 4-7 are cross-sectional views illustrating various stages of a method for forming a circuit redistribution structure 500 according to an embodiment of the present invention.

Figure 4:
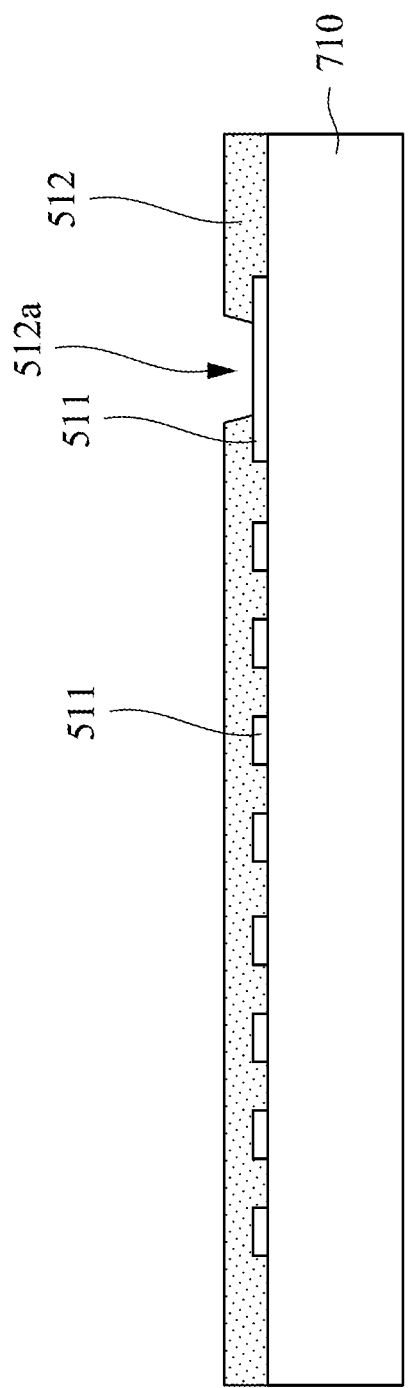
FIGS. 4-7 are cross-sectional views illustrating various stages of a method for forming a circuit redistribution structure according to an embodiment of the present invention.

As shown in FIG. 4, a first circuit layer 511 is formed over a first substrate 710. For example, a conductive material is formed over the first substrate 710, and then the conductive material is patterned to form the first circuit layer 511. In some embodiments, the method of forming the conductive material includes, but is not limited to, electroplating, chemical vapor deposition, physical vapor deposition, and the like. Next, a first insulating layer 512 is formed to cover the first circuit layer 511, and the first insulating layer 512 includes a through-hole 512a exposing a portion of the first circuit layer 511. For example, a dielectric material is formed over the first circuit layer 511, and then the dielectric material is patterned to form the through-hole 512a. In some embodiments, the method of forming the dielectric material includes, but is not limited to, chemical vapor deposition, physical vapor deposition, and the like. In some embodiments, the manner of patterning the conductive material and the dielectric material includes depositing a photoresist on the layer to be patterned, and then exposing and developing the photoresist to form a patterned photoresist layer. Next, the patterned photoresist layer is used as an etch mask to etch the layer to be patterned. The patterned photoresist layer is then removed. Alternatively, in the embodiments where the dielectric material is a photoimageable dielectric, a portion of the photoimageable dielectric can be removed directly by exposure and development to complete the patterning.

Figure 5:
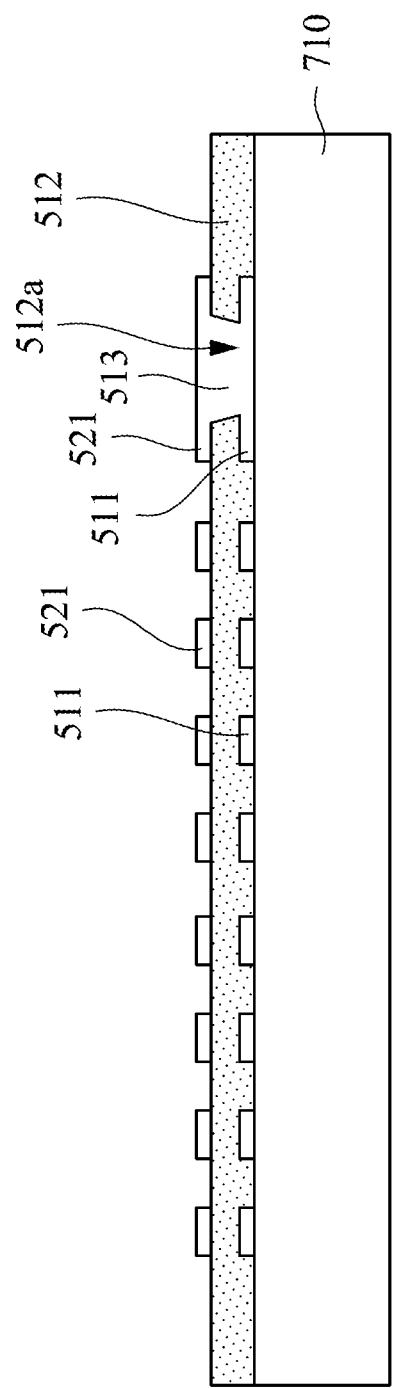

Next, as shown in FIG. 5, a second circuit layer 521 is formed over the first insulating layer 512, and a conductive contact 513 is formed in the through-hole 512a. For example, a conductive material is formed over the first insulating layer 512 and filled in the through-hole 512a. The conductive material is then patterned to form the second circuit layer 521 and the conductive contact 513. It should be noted that the method of forming and patterning the conductive material may be the same as these described above, and the description thereof is omitted.

Figure 6:
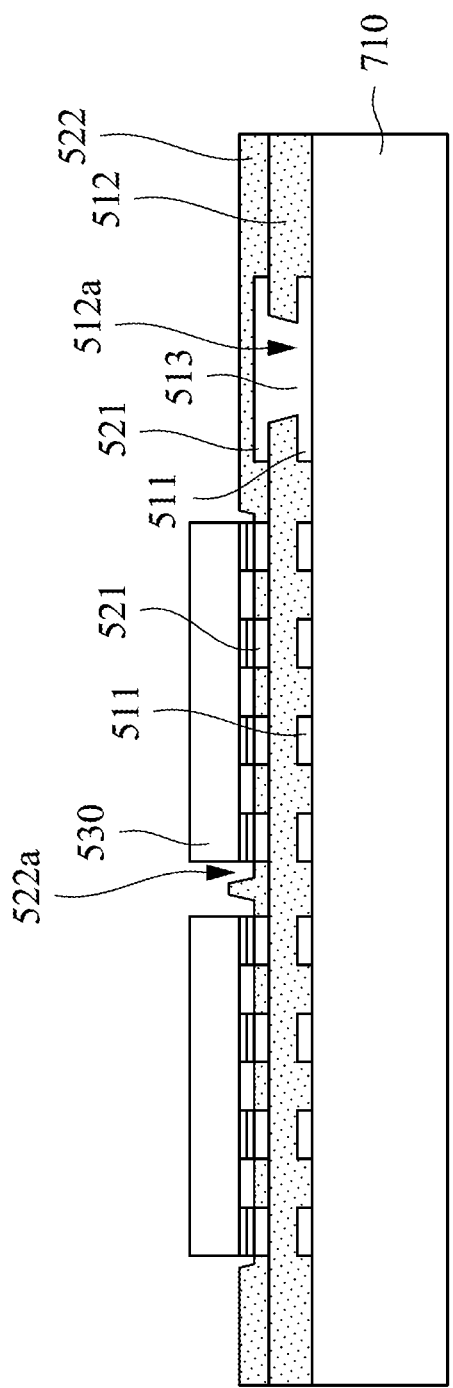

Next, as shown in FIG. 6, a second insulating layer 522 is formed to cover both the second circuit layer 521 and the first insulating layer 512, and the second insulating layer 522 includes an opening 522a exposing a portion of the second circuit layer 521. For example, a dielectric material is formed over the second circuit layer 521 and the first insulating layer 512, and then the dielectric material is patterned to form the opening 522a. It should be noted that the method of forming and patterning the dielectric material are the same as these described above, and the description thereof is omitted. Next, a chip 530 is placed over the second circuit layer 521 and the second insulating layer 522. Specifically, the chip 530 is placed in the opening 522A and electrically connected with the exposed portion of the second circuit layer 521. For example, a solder material is used to bond the metal bumps (eg, chip pins) on the lower surface of the chip 530 with the second circuit layer 521.

Figure 7:
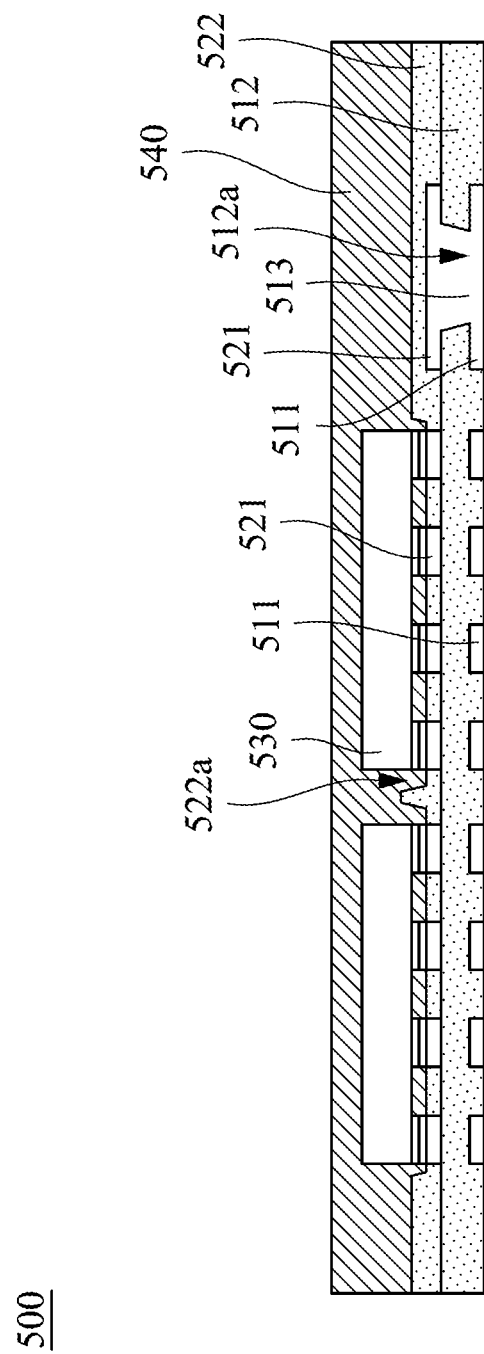

Next, as shown in FIG. 7, a protective layer 540 is formed to cover the chip 530 and the second insulating layer 522, and the protective layer 540 is filled in the gap between the chip 530 and the second insulating layer 522. The first substrate 710 is then peeled off to expose the first circuit layer 511, thereby forming the circuit redistribution structure 500.

Figure 8:
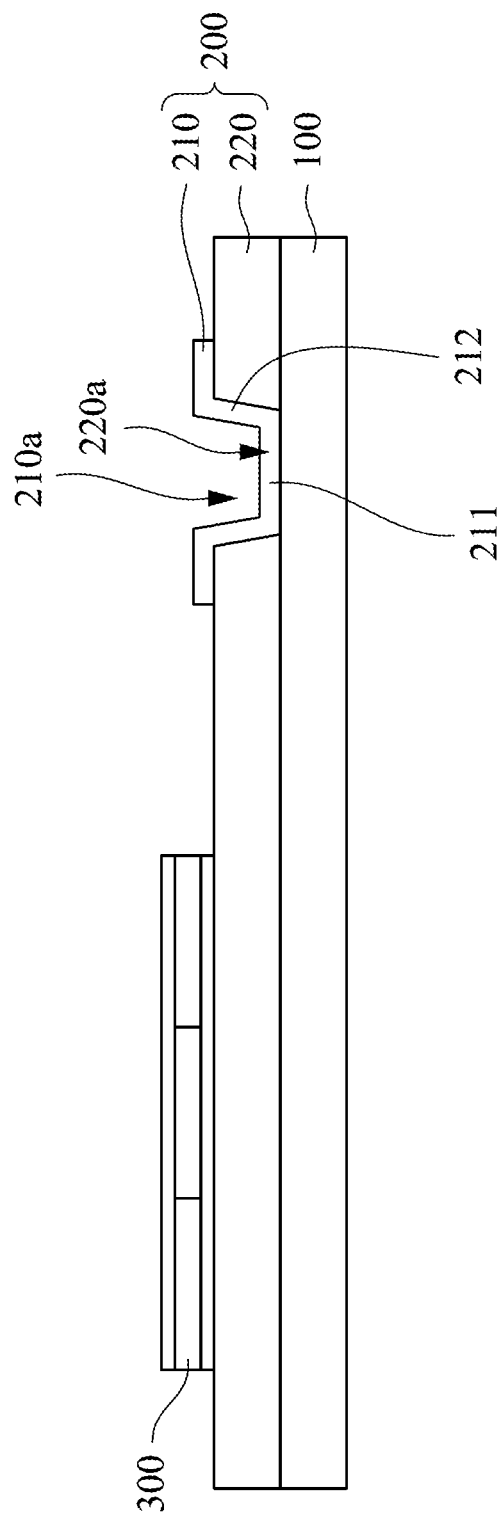
FIG. 8 is a cross-sectional view illustrating a stage of a manufacturing method of a light emitting device package structure according to the first embodiment of the present invention.

FIG. 8 is a cross-sectional view illustrating a stage of a manufacturing method of a light emitting device package structure 10 according to the first embodiment of the present invention. As shown in FIG. 8, a dielectric layer 220 is formed over a second substrate 100, and the dielectric layer 220 includes an opening 220a. For example, a dielectric material is formed over the second substrate 100 and then the dielectric material is patterned to form the opening 220a. It should be noted that the method of forming and patterning the dielectric material are the same as these described above, and the description thereof is omitted. Subsequently, a third circuit layer 210 is formed on the dielectric layer 220 and the bottom surface and sidewalls of the opening 220a. For example, a conductive material is conformally formed on the dielectric layer 220 and the bottom surface and sidewalls of the opening 220a. Next, the conductive material is patterned to form the third circuit layer 210 that includes a bottom portion 211 and a sidewall portion 212. The bottom portion 211 and the sidewall portion 212 define a recess 210a. It should be noted that the method of forming and patterning the conductive material are the same as these described above, and the description thereof is omitted. A light emitting device 300 is then placed over the dielectric layer 220, and the light emitting device 300 is electrically connected with the third circuit layer 210.

Next, the circuit redistribution structure 500 of FIG. 7 is placed over the light emitting device 300 of FIG. 8, wherein the third circuit layer 210 is electrically connected with the first circuit layer 511 through a conductive connector 400, thereby forming the light emitting device package structure 10 as shown in FIG. 1. For example, first, a metal bump or solder material connected to the first circuit layer 511 in the circuit redistribution structure 500 of FIG. 7 is formed. Next, the metal bump or solder material is aligned with the recess 210a. The metal bump or solder material is then thermal compressed with the third circuit layer 210 to form a metal pillar or solder ball that connects the first circuit layer 511 and the third circuit layer 210.

Figure 9:
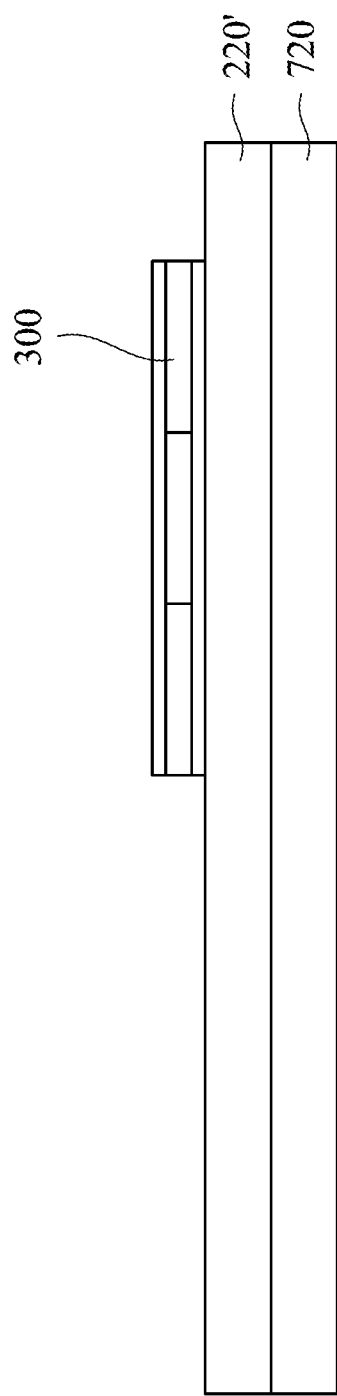
FIGS. 9-11 are cross-sectional views illustrating various stages of a manufacturing method of a light emitting device package structure according to the second embodiment of the present invention.
Figure 10:
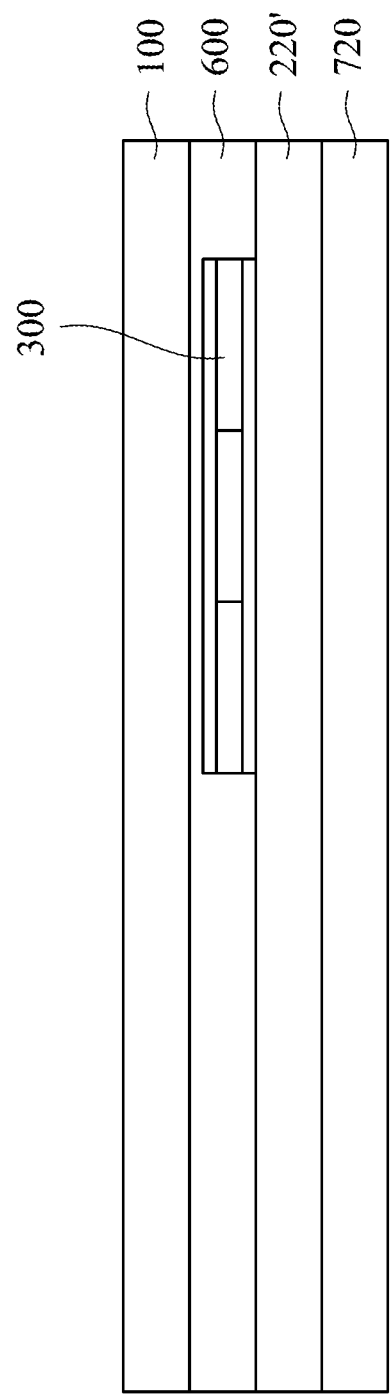
Figure 11:
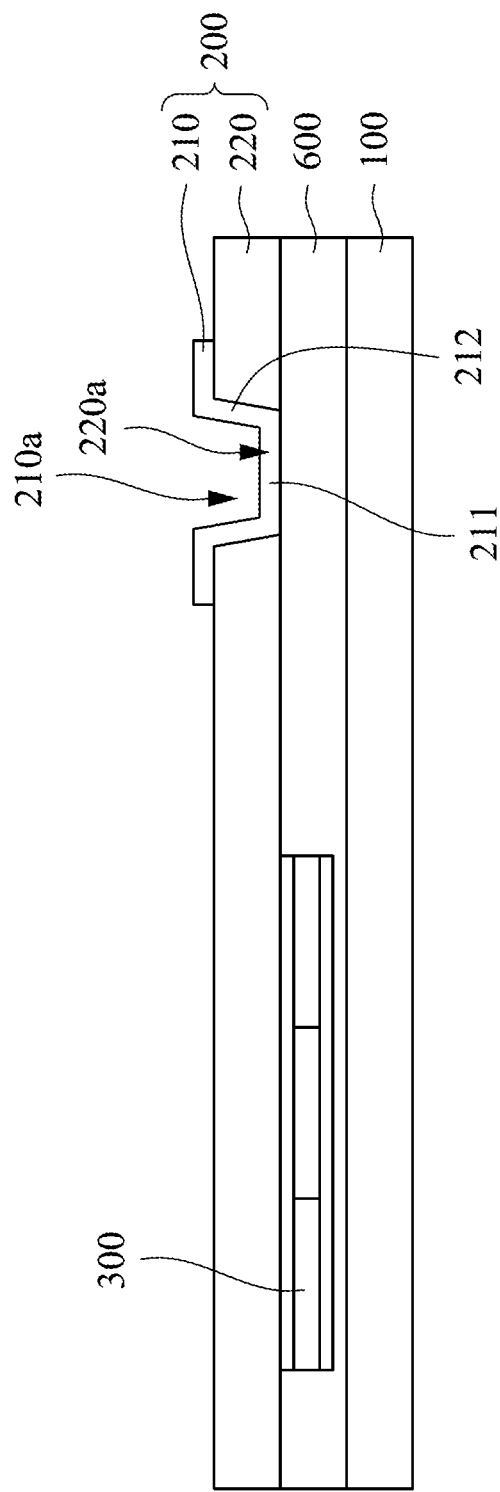

FIGS. 9-11 are cross-sectional views illustrating various stages of a manufacturing method of a light emitting device package structure 10 according to the second embodiment of the present invention. As shown in FIG. 9, a dielectric layer 220' is formed over a first substrate 720. Next, a light emitting device 300 is placed over the dielectric layer 220'.

Next, as shown in FIG. 10, a second substrate 100 is adhered on the light emitting device 300 and the dielectric layer 220'. For example, an optically clear adhesive is used to adhere the second substrate 100 to the light emitting device 300 and the dielectric layer 220', thus forming a transparent adhesive layer 600.

Next, as shown in FIG. 11, the structure of FIG. 10 is flipped upside down, and then the first substrate 720 is peeled off to expose the dielectric layer 220'. Subsequently, the dielectric layer 220' is patterned to form a dielectric layer 220 having an opening 220a. Next, a third circuit layer 210 is formed on the dielectric layer 220 and the bottom surface and sidewalls of the opening 220a, wherein the light emitting device 300 is electrically connected with the third circuit layer 210. In examples, a conductive material is conformally formed on the dielectric layer 220 and the bottom surface and sidewalls of the opening 220a. Next, the conductive material is patterned to form the third circuit layer 210 that includes a bottom portion 211 and a sidewall portion 212. The bottom portion 211 and the sidewall portion 212 define a recess 210a.

Next, the circuit redistribution structure 500 of FIG. 7 is placed over the third circuit layer 210 and the dielectric layer 220 of FIG. 11, such that the third circuit layer 210 is electrically connected with the first circuit layer 511 through a conductive connector 400, thereby forming the light emitting device package structure 10 as shown in FIG. 2. In examples, a metal bump or solder material is first formed to connect with the first circuit layer 511 of the circuit redistribution structure 500 of FIG. 7. Next, the metal bump or solder material is aligned with the recess 210a. The metal bump or solder material is then thermal compressed with the third circuit layer 210 to form a metal pillar or solder ball that connects the first circuit layer 511 and the third circuit layer 210.

Figure 12:
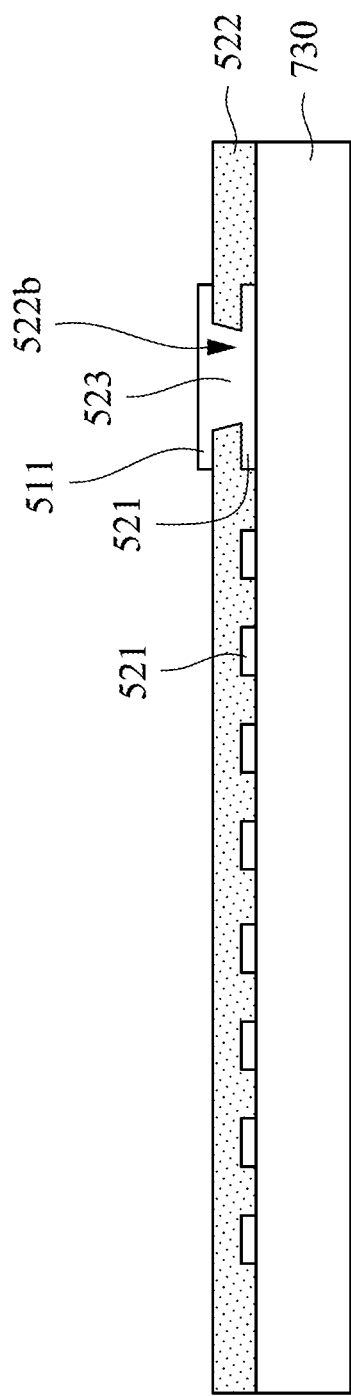
FIGS. 12-14 are cross-sectional views illustrating various stages of a manufacturing method of a light emitting device package structure according to the third embodiment of the present invention.
Figure 13:
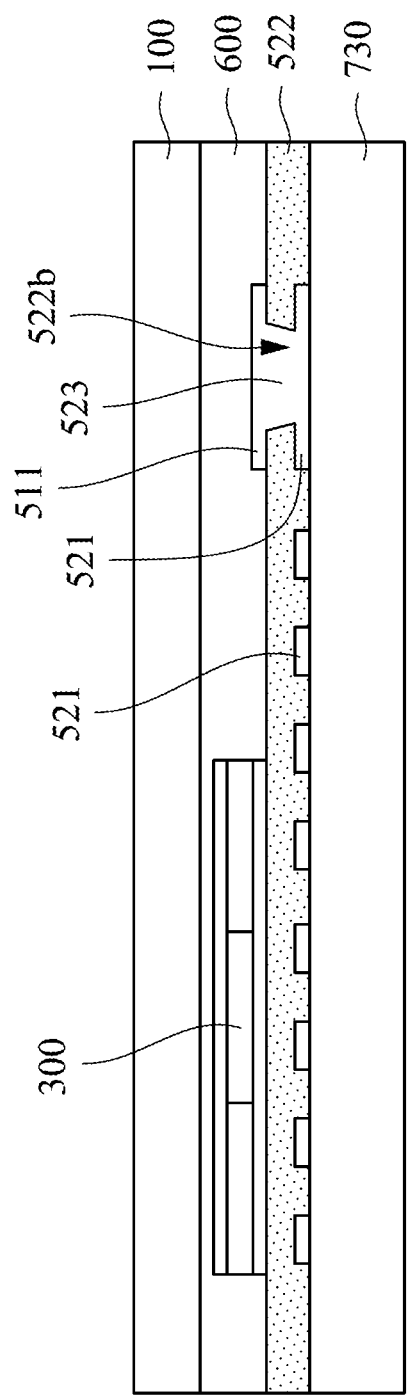
Figure 14:
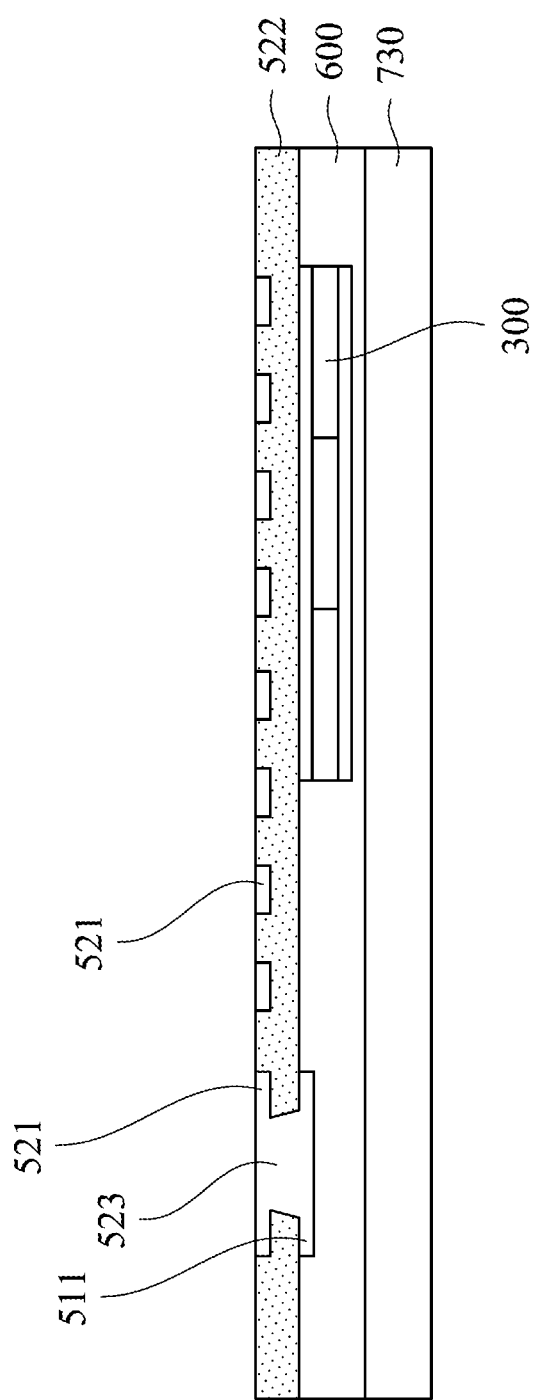

FIGS. 12-14 are cross-sectional views illustrating various stages of a manufacturing method of a light emitting device package structure 10 according to the third embodiment of the present invention. As shown in FIG. 12, a first circuit layer 521 is formed over a first substrate 730. For example, a conductive material is formed over the first substrate 730, and then the conductive material is patterned to form the first circuit layer 521. Next, an insulating layer 522 is formed to cover the first circuit layer 521, and the insulating layer 522 includes a through-hole 522b exposing a portion of the first circuit layer 521. For example, a dielectric material is formed over the first circuit layer 521, and then the dielectric material is patterned to form the through-hole 522b. Subsequently, a second circuit layer 511 is formed over the insulating layer 522, and a conductive contact 523 is formed in the through-hole 522b. For example, a conductive material is formed over the insulating layer 522 and filled in a through-hole 522b. Next, the conductive material is patterned to form the second circuit layer 511 and the conductive contact 523. It should be noted that the method of forming and patterning the conductive material and the dielectric material are the same as these described above, and the description thereof is omitted.

Next, as shown in FIG. 13, a light emitting device 300 is placed over the insulating layer 522, and the light emitting device 300 is electrically connected with the second circuit layer 511. Next, a second substrate 100 is adhered on the light emitting device 300. In examples, an optically clear adhesive is used to adhere the second substrate 100 to the light emitting device 300, the insulating layer 522, and the second circuit layer 511, thus forming a transparent adhesive layer 600.

Next, the structure of FIG. 13 is flipped upside down, and then the first substrate 730 is peeled off to expose the first circuit layer 521 and the insulating layer 522 as shown in FIG. 14.

Next, one or more chips 530 and a protective layer 540 are formed over the first circuit layer 521 and the insulating layer 522, thereby forming the light emitting device package structure 10 as shown in FIG. 3. Specifically, the chips 530 are placed over the first circuit layer 521 and the insulating layer 522, and the chips 530 are electrically connected with the first circuit layer 521. For example, a solder material is used to bond the metal bumps (e.g., chip pins) of the lower surface of the chip 530 with the first circuit layer 521. It should be noted that, as described above, in the case where the light emitting device 300 includes a polysilicon, when the process temperature for bonding the chip 530 with the first circuit layer 521 is too high, the crystal structure of the polycrystalline silicon may be damaged. Therefore, the melting point of the solder material used should be below 600° C., such as tin-bismuth. Next, the protective layer 540 is formed to cover the chip 530, the first circuit layer 521, and the insulating layer 522, and the protective layer 540 is filled in the gap between the chip 530 and the insulating layer 522.

Figure 15:
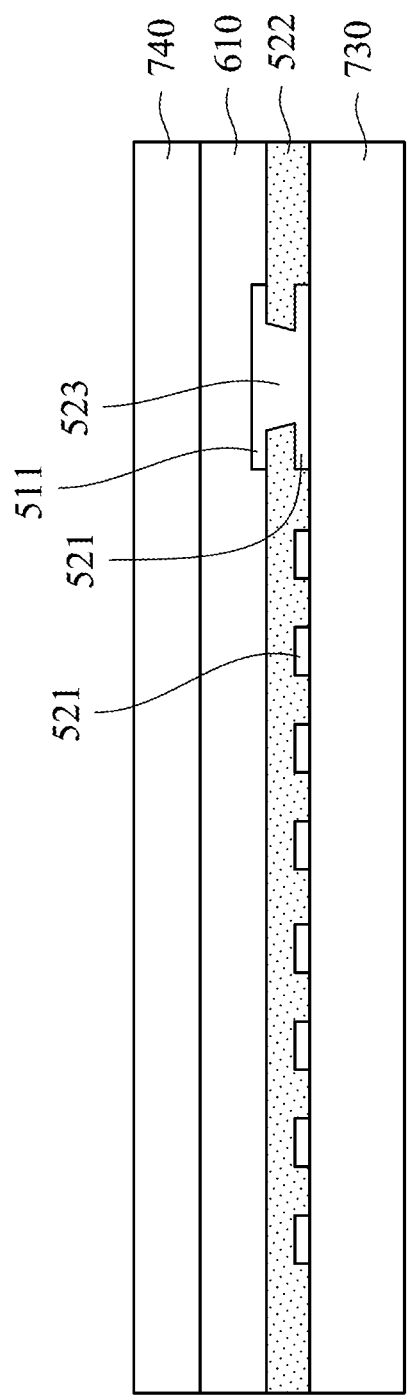
FIGS. 15-18 are cross-sectional views illustrating various stages of another manufacturing method of a light emitting device package structure according to the third embodiment of the present invention.

FIGS. 15-18 are cross-sectional views illustrating various stages of another manufacturing method of the light emitting device package structure 10 of FIG. 3. As shown in FIG. 15, which continues from FIG. 12, a second substrate 740 is adhered on the second circuit layer 511 and the insulating layer 522. For example, an adhesive is used to adhere the second substrate 740 to the second circuit layer 511 and the insulating layer 522, thus forming an adhesive layer 610.

Figure 16:
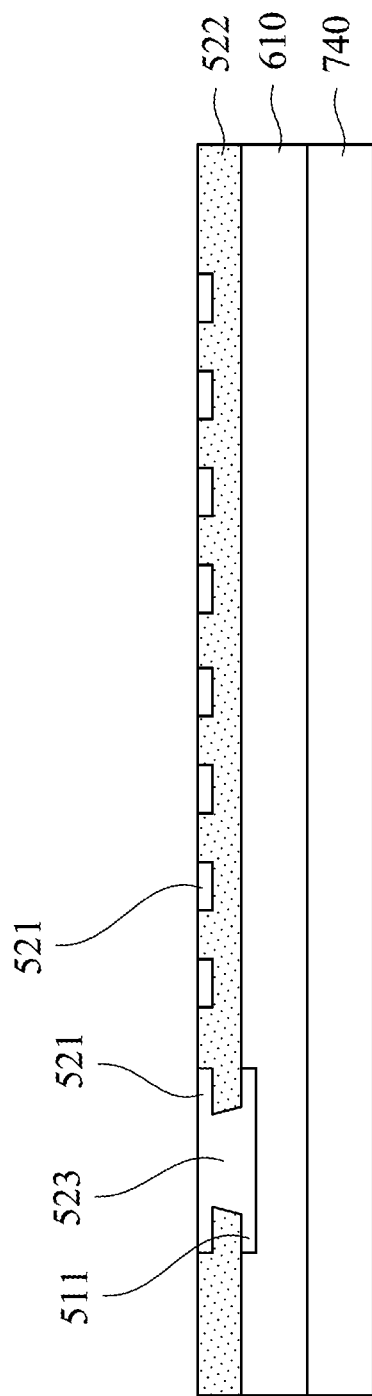

Next, the structure of FIG. 15 is flipped upside down, and then the first substrate 730 is peeled off to expose the first circuit layer 521 and the insulating layer 522 as shown in FIG. 16.

Figure 17:
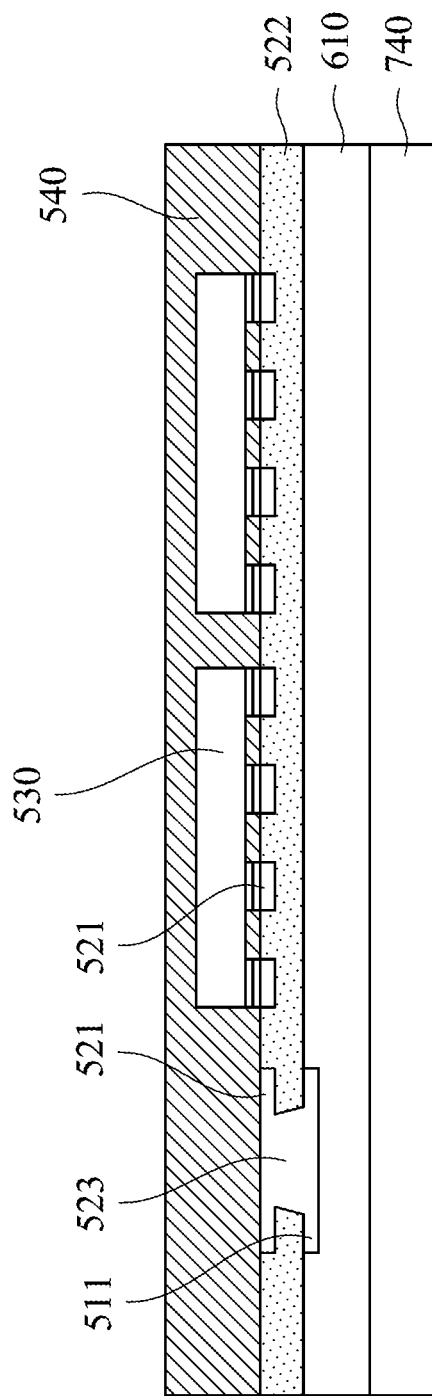

Next, as shown in FIG. 17, one or more chips 530 are placed over the first circuit layer 521 and the insulating layer 522, such that the chips 530 are electrically connected with the first circuit layer 521. Next, a protective layer 540 is formed to cover the chip 530, the first circuit layer 521, and the insulating layer 522, and the protective layer 540 is filled in the gap between the chip 530 and the insulating layer 522.

Figure 18:
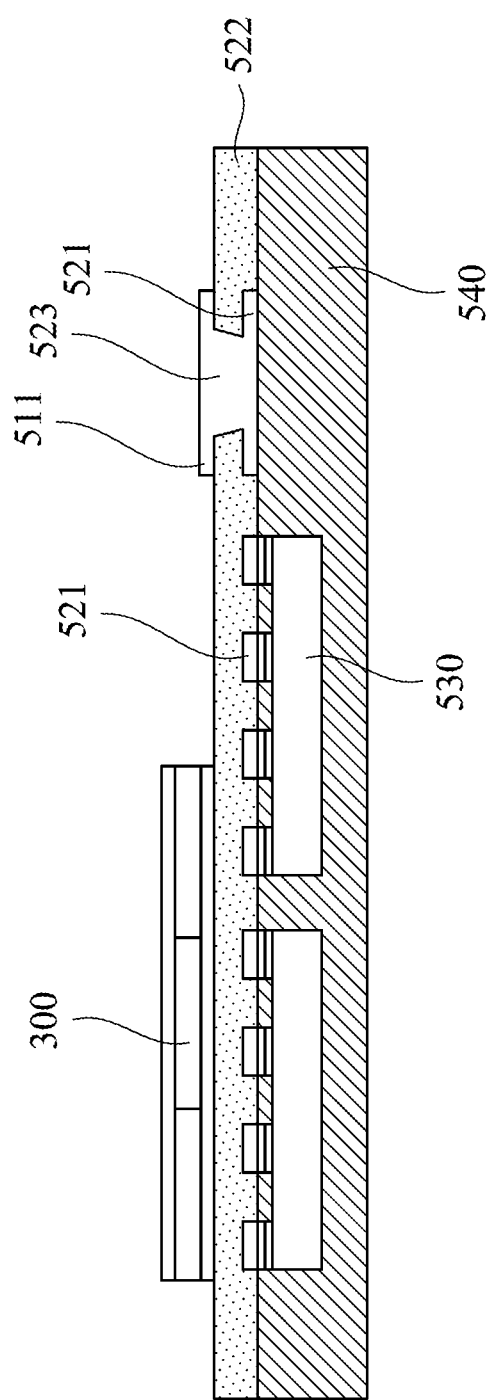

Next, as shown in FIG. 18, the structure of FIG. 17 is flipped upside down, and then the second substrate 740 and the adhesive layer 610 are removed to expose the second circuit layer 511 and the insulating layer 522. Next, a light emitting device 300 is placed over the insulating layer 522, and the light emitting device 300 is electrically connected with the second circuit layer 511. Next, a third substrate 100 is adhered on the light emitting device 300, the insulating layer 522, and the second circuit layer 511, thereby forming the light emitting device package structure 10 as shown in FIG. 3.

From the embodiments described above of the present invention, the circuit redistribution structure, which replaces the traditional chip-on-film (COF) technology, is used to electrically connect the light emitting device to the chip. Therefore, the problems that the portion of the flexible circuit board that contacts the substrate is easily peeled off or broken and the wiring on the flexible circuit board is easily broken are avoided. In addition, it is not necessary to reserve a space of the substrate for connecting with the flexible circuit board, so that the peripheral area of the display device can be effectively narrowed.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light emitting device package structure, comprising:
   a protective substrate;
   a circuit layer structure disposed over the protective substrate, wherein the circuit layer structure includes a first circuit layer;
   a light emitting device disposed over the circuit layer structure or between the protective substrate and the circuit layer structure, wherein the light emitting device is electrically connected with the first circuit layer;
   a first redistribution layer disposed over the light emitting device, wherein the first redistribution layer includes a second circuit layer and a conductive contact that contacts the second circuit layer;
   a conductive connector connecting the first circuit layer and the second circuit layer;
   a second redistribution layer disposed over the first redistribution layer, wherein the second redistribution layer includes a third circuit layer that contacts the conductive contact; and
   a chip disposed over the second redistribution layer and electrically connected with the third circuit layer.

2. The light emitting device package structure of claim 1, wherein the first redistribution layer further includes a first insulating layer covering the second circuit layer, wherein the first insulating layer has a through-hole exposing a portion of the second circuit layer, wherein the conductive contact fills the through-hole and contacts the second circuit layer.

3. The light emitting device package structure of claim 1, wherein the second redistribution layer further includes a second insulating layer covering the third circuit layer, wherein the second insulating layer has an opening exposing a portion of the third circuit layer, wherein the chip is electrically connected with the third circuit layer through the opening.

4. The light emitting device package structure of claim 1, wherein a line width and a line pitch of the second circuit layer are less than 8 micrometers, and a line width and a line pitch of the third circuit layer are less than 8 micrometers.

5. A light emitting device package structure, comprising:
   a protective substrate;
   a light emitting device disposed over the protective substrate;
   a transparent adhesive layer covering a sidewall of the light emitting device, wherein an upper surface of the transparent adhesive layer is leveled with an upper surface of the light emitting device;
   a first redistribution layer disposed over the light emitting device, wherein the first redistribution layer includes a first circuit layer that is electrically connected with the light emitting device;
   a second redistribution layer disposed over the first redistribution layer, wherein the second redistribution layer includes a second circuit layer and a conductive contact that contacts the first circuit layer and the second circuit layer; and
   a chip disposed over the second redistribution layer and electrically connected with the second circuit layer.

6. The light emitting device package structure of claim 5, wherein the second redistribution layer further includes an insulating layer covering the first circuit layer, and the insulating layer has a through-hole exposing a portion of the first circuit layer, wherein the conductive contact fills the through-hole and contacts the first circuit layer and the second circuit layer.

7. The light emitting device package structure of claim 5, wherein a line width and a line pitch of the first circuit layer are less than 8 micrometers, and a line width and a line pitch of the second circuit layer are less than 8 micrometers.

* * * * *